(12) United States Patent
Delgado et al.

(10) Patent No.: US 10,395,884 B2
(45) Date of Patent: Aug. 27, 2019

(54) RUTHENIUM ENCAPSULATED PHOTOCATHODE ELECTRON EMITTER

(71) Applicant: KLA-TENCOR CORPORATION, Milpitas, CA (US)

(72) Inventors: Gildardo R. Delgado, Livermore, CA (US); Rudy F. Garcia, Union City, CA (US); Katerina Ioakeimidi, San Francisco, CA (US); Frances Hill, Sunnyvale, CA (US); Michael E. Romero, San Jose, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 16/150,675

(22) Filed: Oct. 3, 2018

(65) Prior Publication Data
US 2019/0108966 A1    Apr. 11, 2019

Related U.S. Application Data (60) Provisional application No. 62/570,438, filed on Oct. 10, 2017.

(51) Int. Cl.
  *H01J 19/24* (2006.01)
  *H01J 37/06* (2006.01)
  *H01J 37/28* (2006.01)

(52) U.S. Cl.
  CPC ............. *H01J 37/06* (2013.01); *H01J 19/24* (2013.01); *H01J 37/28* (2013.01); *H01J 2201/30449* (2013.01)

(58) Field of Classification Search
  CPC .. H01J 37/06; H01J 37/28; H01J 19/24; H01J 2201/30449
  See application file for complete search history.

(56) References Cited

U.S. PATENT DOCUMENTS

| | | | |
|---|---|---|---|
| 5,363,021 A | 11/1994 | MacDonald | |
| 6,833,550 B2 * | 12/2004 | Hayashibara | H01J 37/02 250/441.11 |
| 7,074,719 B2 | 7/2006 | Kim et al. | |
| 7,507,958 B2 | 3/2009 | Choi et al. | |
| 8,664,853 B1 * | 3/2014 | Montgomery | H01J 40/06 313/13 |
| 2004/0051046 A1 * | 3/2004 | Ferenc | H01J 9/244 250/370.08 |
| 2004/0140432 A1 | 7/2004 | Maldonado et al. | |
| 2005/0118807 A1 | 6/2005 | Kim et al. | |

(Continued)

OTHER PUBLICATIONS

Zhu et al, Material Research Society Symposium Proceedings vol. 1539, 2013 "Surface Modifications to a SiC Photocathode Using Ruthenium nanoparticles" (Year: 2013).*

(Continued)

*Primary Examiner* — Donald L Raleigh
(74) *Attorney, Agent, or Firm* — Hodgson Russ LLP (57) ABSTRACT

A photocathode structure, which can include an alkali halide, has a protective film on an exterior surface of the photocathode structure. The protective film includes ruthenium. This protective film can be, for example, ruthenium or an alloy of ruthenium and platinum. The protective film can have a thickness from 1 nm to 20 nm. The photocathode structure can be used in an electron beam tool like a scanning electron microscope.

20 Claims, 5 Drawing Sheets

(56) References Cited

U.S. PATENT DOCUMENTS

| | | | |
|---|---|---|---|
| 2007/0164214 A1* | 7/2007 | Choi | B82Y 15/00 |
| | | | 250/306 |
| 2008/0012587 A1 | 1/2008 | Wei et al. | |
| 2014/0020709 A1 | 1/2014 | Kikuchi et al. | |
| 2018/0005791 A1 | 1/2018 | Schultz et al. | |
| 2018/0174794 A1 | 6/2018 | Delgado et al. | |
| 2018/0191265 A1* | 7/2018 | Bennett | H02M 7/006 |
| 2018/0364513 A1* | 12/2018 | Wang | G02F 1/13439 |

OTHER PUBLICATIONS

ISA/KR, International Search Report and Written Opinion for PCT/US2018/055287 dated Feb. 1, 2019.

* cited by examiner

| Method | λ1 (nm) | λ2 (nm) | λ3 (nm) | Comments |
|---|---|---|---|---|
| Activate with λ1, pump with λ2 | 350-257 | 350-213 | | λ2(eV)>6.3eV-λ1(eV) |
| Activate with λ1, pump with λ1 and λ2 | 350-257 | 350-213 | | λ2(eV)>6.3eV-λ1(eV) Keeps activation and prevents defects from recombining |
| Pump with λ1 and λ3 (EIT-EM induced transparency) | 350-257 | | <213 | Keeps defects from consuming photoemissive wavelengths |

RUTHENIUM ENCAPSULATED PHOTOCATHODE ELECTRON EMITTER

CROSS-REFERENCE TO RELATED APPLICATIONS

This application claims priority to the provisional patent application filed Oct. 10, 2017 and assigned U.S. App. No. 62/570,438, the disclosure of which is hereby incorporated by reference.

FIELD OF THE DISCLOSURE

This disclosure relates to protective films for electron emitters.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Electron beams are used in a number of different applications during semiconductor manufacturing. For example, electron beams can be modulated and directed onto an electron-sensitive resist on a semiconductor wafer, mask, or other workpiece to generate an electron pattern on the workpiece. Electron beams also can be used to inspect a wafer by, for example, detecting electrons emerging or reflected from the wafer to detect defects, anomalies, or undesirable objects.

These inspection processes are used at various steps during a semiconductor manufacturing process to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

Photocathodes also have been used to generate electron beams. A single light beam incident on a photocathode system can generate a single electron beam with high brightness that is capable of delivering high electron current density. However, a problem with single electron beam systems is that even with high brightness systems, single electron beam systems still have relative low throughput for inspection. Low throughput is a drawback to electron beam inspection. With currently-available electron beam sources, thousands of beams would be required.

Alkali halide photo electron emitters are used as photocathode emitters in the ultraviolet spectral range. CsBr and CsI photocathodes are used for high quantum efficiency with light in the deep ultraviolet (DUV) range. Such photocathodes are known to lose performance due to the vacuum environment and exposure to DUV photons. There is no clear method to prevent this from occurring over the system's lifetime.

Photocathode electron emitters generally do not have a protective coating to protect them from oxidation or carbon build up from the vacuum environment. Existing protective cap layers on photocathodes are not robust to cleaning. Therefore, these cap layers cannot protect a photocathode electron emitter during operation.

Besides the issue with deteriorating performance, single wavelengths that have been used are not tailored to the energy bands of the photocathode material. Thus, the quantum efficiency, emittance, energy spread, and heat dissipation are not optimized.

Alkali halide photocathodes such as CsI and CsBr have demonstrated photoemission from intraband states when illuminated with wavelengths much longer than their bandgap energy. So far, the illumination schemes to pump these photocathodes involve either short wavelengths with energies larger than the bandgap or longer wavelengths that first activate the color centers located at about 4.7 eV above the valence band. These schemes have been tried both in transmission and in reflection mode. For reflection mode, 257 nm and 266 nm beams have successfully activated the color centers and photogenerated electrons in vacuum. A 410 nm beam was not successful at activating defects and simultaneously transferring the electrons to vacuum.

Therefore, improved photocathode electron emitters are needed.

BRIEF SUMMARY OF THE DISCLOSURE

A system is provided in a first embodiment. An electron emitter includes a photocathode structure and a protective film disposed on an exterior surface of the photocathode structure. The protective film includes ruthenium.

In an instance, the photocathode structure includes an alkali halide. The alkali halide can include CsBr or CsI.

The photocathode may include a ruthenium layer on a side of the photocathode structure opposite from the protective film.

The photocathode may include a metal layer on a side of the photocathode structure opposite from the protective film.

The protective film can include an alloy of ruthenium and platinum. The protective film may have a thickness from 1 nm to 20 nm. The protective film may be free of pinholes in at least an emitting area of the photocathode structure. The protective film may be free of bubbles and inclusions in at least an emitting area of the photocathode structure. The protective film may have imperfections only with a diameter or length dimension less than 1 nm. The protective film may have a porosity less than or equal to 25%. The protective film may have a packing density of greater than or equal to 0.92.

The protective film may have fewer than $10^4$ impurities over an emitting area of the photocathode structure. The impurities can include carbon, oxides, oxygen as a dissolved gas, sodium, or potassium.

An electron beam tool can include the electron emitter of the first embodiment. The electron beam tool can includes a detector that receives electrons generated by the electron emitter and reflected from a surface of a wafer.

A method is provided in a second embodiment. A photocathode structure is provided. A protective film is deposited on an exterior surface of the photocathode structure. The depositing can include ion sputtering, magnetron sputtering, or atomic layer deposition. The photocathode structure may include an alkali halide.

A method is provided in a third embodiment. A photocathode structure is provided. The photocathode includes an alkali halide and a protective film disposed on an exterior surface of the photocathode structure. The protective film includes ruthenium. An electron beam is generated from the photocathode structure when photons are directed at the photocathode structure.

A plasma clean of the photocathode structure may be performed.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Ruthenium or a ruthenium alloy can be used to encapsulate one or more surfaces of a photocathode. Photocathodes are affected by vacuum conditions that can deteriorate the field emission performance. To maintain high electron current stability and lifetime, the photocathode can be wholly or partly encapsulated with a ruthenium protective film. The ruthenium protective film renders the photocathode resistant to oxidation and carbon build up. The ruthenium protective film also has a relative low sputter yields and can withstand erosion by ions. Additionally, ruthenium is a metal and may have advantages over using the photocathode by itself. For example, use of ruthenium may provide higher current stability and/or operation at higher pressures.

Under ultra-high vacuum (UHV) conditions during electron beam emission, carbon layer growth occurs on photocathode surfaces. Likewise, oxidation of surfaces occurs over time even in UHV environments. Carbon or oxidation are determinable effects on cathode performance. A protective film that can protect from oxidation and carbon build up would be beneficial. A protective film with ruthenium or a ruthenium alloy can provide these benefits.

The brightness of a photocathode emitter depends primarily on the photocathode material and the excitation wavelength with a general tradeoff between quantum efficiency and emittance. Dual wavelength excitation or dual transmission/reflection excitation schemes can be used for brightness optimization.

Photocathodes are electron sources that emit electrons when a photocathode structure is exposed to a source of light, either in transmission or reflection mode. The photocathode structure can be a bulk material, a film, or series of films deposited on a substrate. The wavelength(s) of the light can be selected to optimize the amount of emission currents and energy spread of the emitted electrons. The current produced by photocathodes may be more stable than the current produced by cold field emitters. Many materials can be used for photoemission, including silicon, silicon with a metal coating, or an alkali halide.

Figure 1:
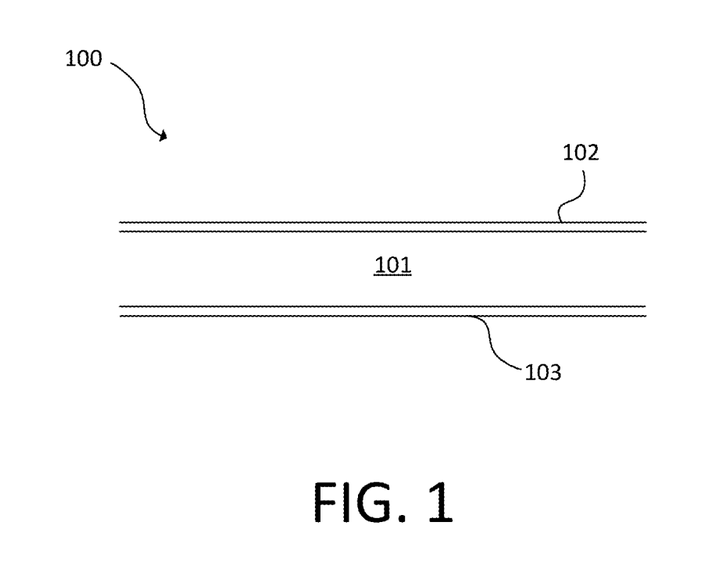
FIG. 1 is a cross-sectional diagram of an embodiment of an electron emitter in accordance with the present disclosure.

FIG. 1 is a cross-sectional diagram of an embodiment of an electron emitter 100. The electron emitter 100 includes a photocathode structure 101. The photocathode structure 101 can include an alkali halide, such as CsBr or CsI. The photocathode structure 101 also can include other semiconductor photocathode materials. The photocathode structure 101 may include planar features.

A protective film 102 is disposed on an exterior surface of the photocathode structure 101. The protective film 102 includes ruthenium. For example, the protective film 102 may be ruthenium or a ruthenium alloy, such as an alloy of ruthenium and platinum.

The electron emitter 100 can optionally include a layer 103 on a side of the photocathode structure 101 opposite from the protective film 102. The layer 103 may include ruthenium or may be another metal.

Introducing voltage to the protective film 102 and/or layer 103 can provide control of electron migration to desired surface. For example, if the layer 103 on the back side of the electron emitter 100 is positively charged, electrons can be made to migrate to the exit surface to enhance electron emission.

The protective film 102 can have a thickness from 1 nm to 20 nm or from 1 nm to 10 nm, including all values to the 0.1 nm and ranges in between. This thickness can be measured from an outer surface of the photocathode structure 101 or another layer that the protective film 102 is disposed on. The optimal thickness of the protective film 102 can be configured for optimal electron emission. Larger thicknesses, while feasible, may affect efficiency. The thickness may depend on the electron emitter 100 extractor configuration and wavelength used for photo electron emission. If the thickness is too large, then it will absorb all the light and/or will not allow electrons to escape easily by increasing the work function. As the protective film 102 generally provides a protective function, it can be thick enough to protect the photocathode structure 101 without affecting performance. The protective film 102 also can supply electrons, so the thickness can vary with the wavelength of light used for electron generation.

The protective film 102 may be free of pinholes in at least an emitting area of the photocathode structure 101. The protective film 102 can have a porosity less than or equal to 25%. Protection may be compromised if the porosity is greater than 25%. The protective film 102 can have a packing density of greater than or equal to 0.92. Protection may be compromised with a packing density less than 0.92.

The protective film 102 can be deposited by ion or magnetron sputtering, atomic layer deposition (ALD), or by other methods that provide a dense, pinhole-free, uniform protective film 102. Porosity (P) can be defined and measured using index of refraction with the following equation.

$$P = \left[1 - \left(\frac{n_f^2 - 1}{n_b^2 - 1}\right) \times 100\%\right]$$

In the previous equation, of is the refractive index of the protective film 102 and $n_b$ is the refractive index of the material. The packing density (PD) of a film is defined as the ratio of the average film density ($\rho_f$) and the bulk density ($\rho_B$) using the following equation.

$$PD = \rho_f/\rho_B$$

The correlation between the film refractive index and its packing density can be expressed with the following equation.

$$PD = \frac{(n_f^2 - 1) \times (n_b^2 + 2)}{(n_f^2 + 2) \times (n_b^2 - 1)}$$

The protective film 102 may be free of bubbles and inclusions in at least an emitting area. For example, the protective film 102 may include imperfections only with a diameter or length dimension less than 1 nm.

The protective film 102 may have fewer than $10^4$ impurities over an emitting area. The impurities can include carbon, oxides, oxygen as a dissolved gas, sodium, or potassium.

The protective film 102 can be robust for electron field emission, robust in the presence of high electric fields, robust to ion sputtering, and robust to plasma or other cleaning methods. Oxidation and/or carbon can be removed from the protective film 102 without damaging the protective film 102. For example, the protective film 102 can be cleaned to atomic levels by molecular hydrogen, hydrogen plasmas, or other plasmas.

Besides allowing cleaning without damaging the protective film 102, the protective film 102 also is resistant to oxidation and carbon contamination. Ruthenium may have the ability to break apart gas molecules that land on its surface or prevent adherence of such gas molecules to its surface. These molecules are capable of distorting the extraction field on the surface of the electron emitter 100 and causing enhanced emission which translates as noise in the beam because of the mobility and residence time of the molecule on the surface. Thus, the protective film 102 can be self-cleaning.

The protective film 102 on the photocathode structure 101 can control electromigration to a desired surface, such as during application of a voltage. Electromigration can be controlled with the protective film 102 on one surface of the photocathode structure 101 and ruthenium or another metal on an opposite surface of the photocathode structure 101. The protective film 102 also may provide improved angular spread of the electron beam.

Use of the protective film 102 can enable operation of the electron emitter 100 at a higher pressure. Photocathodes generally can operate at approximately $10^{-11}$ Torr. With a protective film 102, the electron emitter 100 may be able to operate at approximately $10^{-9}$ Torr.

The protective film 102 is transparent to UV wavelengths. This can enable operation of the electron emitter 100 in both transmission and reflection modes.

Embodiments of the electron source 100 can be used as the electron source in reticle and wafer inspection systems. For example, embodiments of the electron source 100 can be used as the electron source in electron beam wafer or reticle inspection systems using single or multiple electron sources, electron beam wafer or reticle review systems using single or multiple electron sources, or electron beam wafer or reticle metrology systems using single or multiple electron sources. Embodiments of the electron source 100 also can be used in systems that generate x-rays using single or multiple electron sources in wafer or reticle metrology, review, or inspection.

Multiple wavelengths can be applied to the photocathode structure 101 that includes an alkali halide, such as CsBr or CsI. The multiple wavelengths can be applied in both reflection and transmission mode to activate and pump intraband states (e.g., color centers) of the alkali halide. The multiple wavelengths can activate the centers and transfer electrons to vacuum.

Use of multiple wavelengths can increase quantum efficiency and/or achieve the same quantum efficiency as with a single wavelength while producing less heat. Less complex lasers systems can be used to generate multiple wavelengths than a single wavelength. For example, a longer wavelength can use a less complex laser system or optics. Less energy spread of the photogenerated electrons and lower emittance can be achieved.

Figure 2:
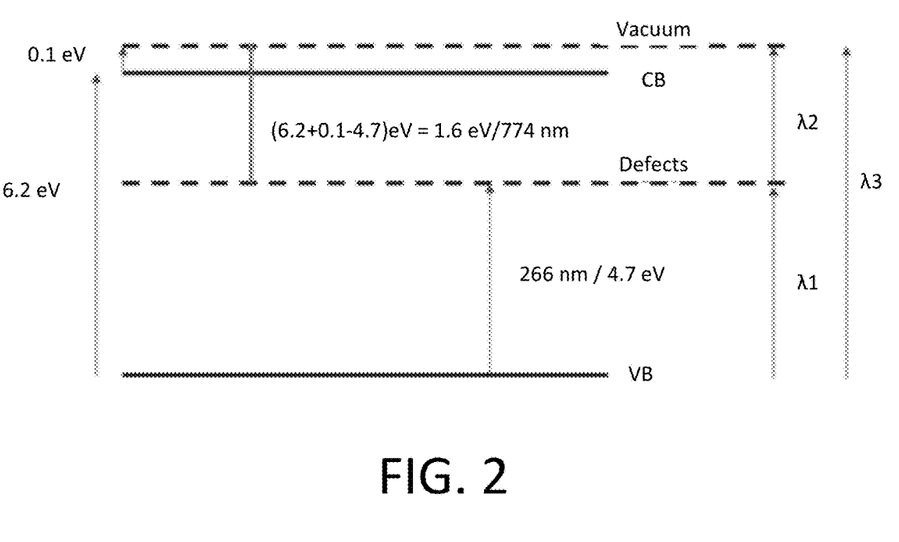
FIG. 2 is a bandgap structure for a CsI photocathode.

Based on the wavelength assignment of FIG. 2, the proposed pumping schemes are: activate color centers with λ1 and pump the cathode with 2; activate with λ1, pump with λ1 and 2; and/or pump with λ1 and λ3. FIG. 2 illustrates the conduction band (CB) and valence band (VB).

Figure 3:
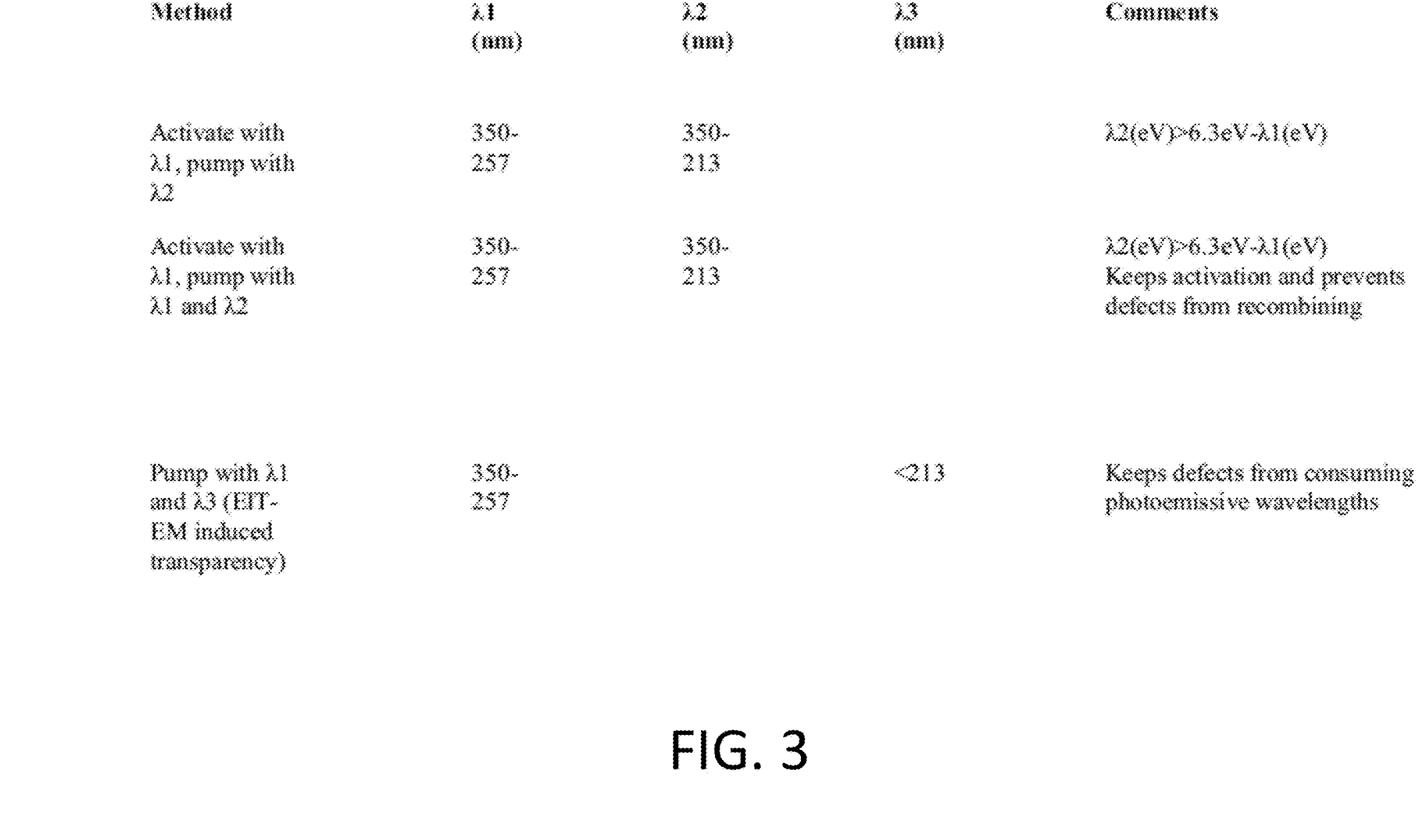
FIG. 3 is a table of pumping schemes.

The third pumping scheme using two wavelengths may be an equivalent to electromagnetically-induced transparency (EIT) where λ1 blocks the color centers from absorbing λ3, which can enable electrons to be pumped directly from the valence band to vacuum. A potential combination of wavelengths for CsI is shown in the table of FIG. 3.

The dual wavelength pumping scheme can minimize required optical power per photogenerated electron, which can provide higher quantum efficiency. Heat dissipation per photogenerated electron also can be minimized. A dual wavelength pumping scheme also can provide improve localization of induced current.

Dual wavelength pumping schemes can be performed concurrently in transmission and reflection mode, which can optimize efficiency.

Longer photocathode and optics lifetimes can be achieved with longer wavelength illumination, such as those using a dual wavelength pumping scheme. Lower emittance and energy spread also can be achieved using longer wavelengths, such as with a dual wavelength pumping scheme.

Figure 4:
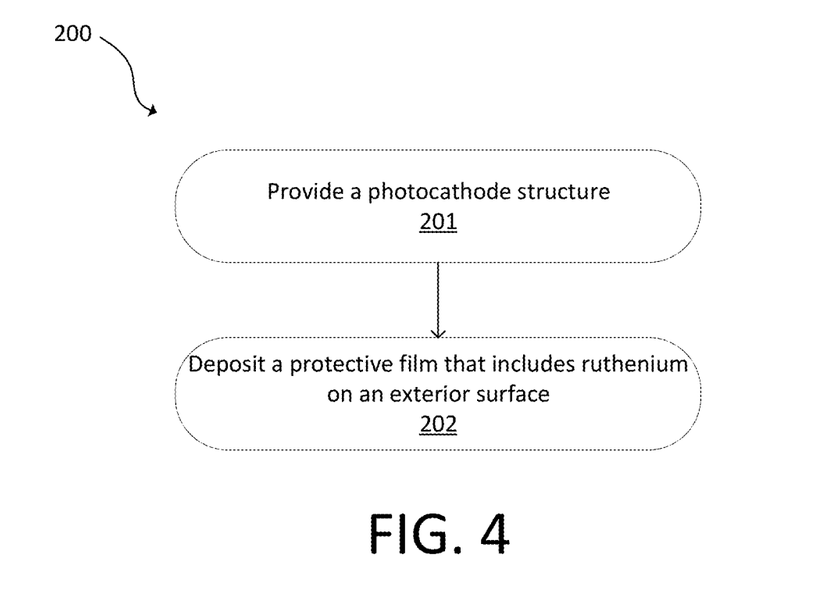
FIG. 4 is a flowchart of a method embodiment in accordance with the present disclosure.

FIG. 4 is a flowchart of a method 200. A photocathode structure is provided at 201. The photocathode structure includes an alkali halide. A protective film that includes ruthenium is deposited on an exterior surface of the photocathode structure at 202. The deposition can include ion sputtering, magnetron sputtering, or ALD. The deposition can provide the desired film density, conformal nature, and amount of pinhole defects.

Figure 5:
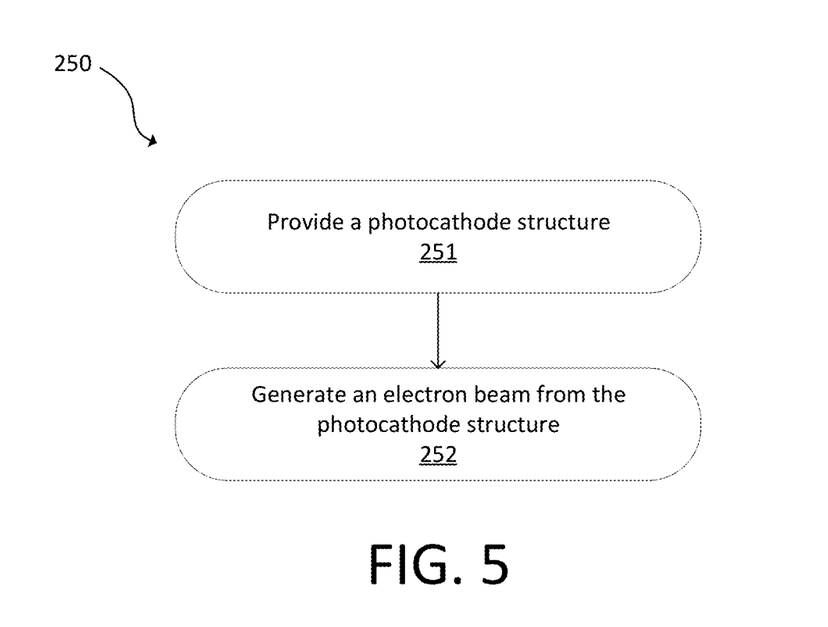
FIG. 5 is a flowchart of another method embodiment in accordance with the present disclosure.

FIG. 5 is a flowchart of a method 250. A photocathode structure is provided at 251. The photocathode structure includes an alkali halide and a protective film disposed on an exterior surface of the photocathode structure. The protective film includes ruthenium. An electron beam is generated from the photocathode structure at 252 when photons are directed at the photocathode structure. Electron generation may occur at approximately $10^{-5}$ Torr or less. A plasma clean can optionally be performed on the photocathode structure after the electron beam is generated.

The electron beam produced using the photocathode structure with the protective film can have a higher quantum efficiency than a photocathode structure without the protective film.

Figure 6:
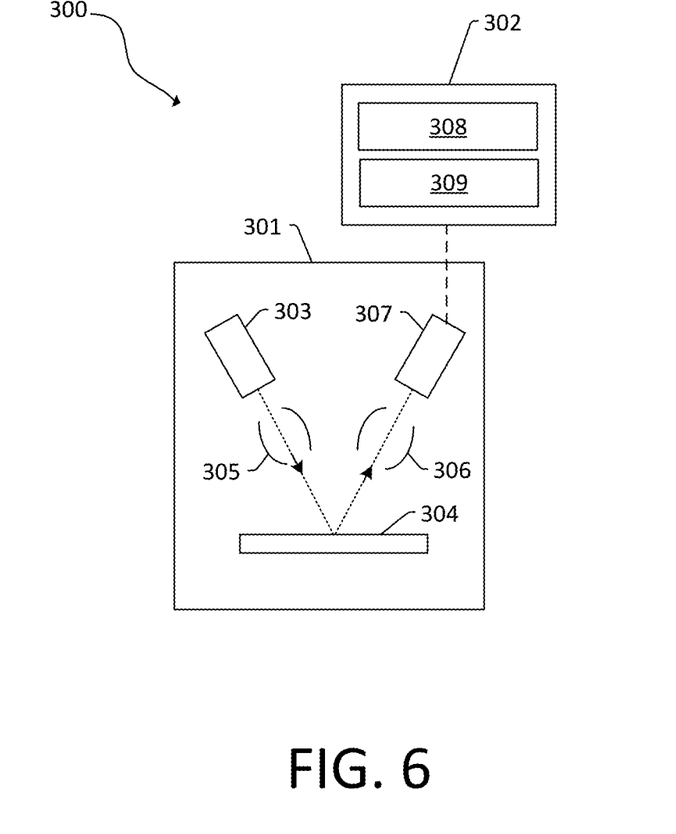
FIG. 6 is a block diagram of an embodiment of a system in accordance with the present disclosure.

FIG. 6 is a block diagram of an embodiment of a system 300. The system 300 includes a wafer inspection tool (which includes the electron column 301) configured to generate images of a wafer 304.

The wafer inspection tool includes an output acquisition subsystem that includes at least an energy source and a detector. The output acquisition subsystem may be an electron beam-based output acquisition subsystem. For example, in one embodiment, the energy directed to the wafer 304 includes electrons, and the energy detected from the wafer 304 includes electrons. In this manner, the energy source may be an electron beam source. In one such embodiment shown in FIG. 6, the output acquisition subsystem includes electron column 301, which is coupled to computer subsystem 302. A chuck (not illustrated) may hold the wafer 304.

As also shown in FIG. 6, the electron column 301 includes an electron beam source 303 configured to generate electrons that are focused to wafer 304 by one or more elements 305. The electron beam source 303 may include, for example, an embodiment of the electron source 100 of FIG. 1. The one or more elements 305 may include, for example, a gun lens, an anode, a beam limiting aperture, a gate valve, a beam current selection aperture, an objective lens, and a scanning subsystem, all of which may include any such suitable elements known in the art.

Electrons returned from the wafer 304 (e.g., secondary electrons) may be focused by one or more elements 306 to detector 307. One or more elements 306 may include, for example, a scanning subsystem, which may be the same scanning subsystem included in element(s) 305.

The electron column also may include any other suitable elements known in the art.

Although the electron column 301 is shown in FIG. 6 as being configured such that the electrons are directed to the wafer 304 at an oblique angle of incidence and are scattered from the wafer 304 at another oblique angle, the electron beam may be directed to and scattered from the wafer 304 at any suitable angles. In addition, the electron beam-based output acquisition subsystem may be configured to use multiple modes to generate images of the wafer 304 (e.g., with different illumination angles, collection angles, etc.). The multiple modes of the electron beam-based output acquisition subsystem may be different in any image generation parameters of the output acquisition subsystem.

Computer subsystem 302 may be coupled to detector 307 such that the computer subsystem 302 is in electronic communication with the detector 307 or other components of the wafer inspection tool. The detector 307 may detect electrons returned from the surface of the wafer 304 thereby forming electron beam images of the wafer 304 with the computer subsystem 302. The electron beam images may include any suitable electron beam images. The computer subsystem 302 includes a processor 308 and an electronic data storage unit 309. The processor 308 may include a microprocessor, a microcontroller, or other devices.

It is noted that FIG. 6 is provided herein to generally illustrate a configuration of an electron beam-based output acquisition subsystem that may be used in the embodiments described herein. The electron beam-based output acquisition subsystem configuration described herein may be altered to optimize the performance of the output acquisition subsystem as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

The computer subsystem 302 may be coupled to the components of the system 300 in any suitable manner (e.g., via one or more transmission media, which may include wired and/or wireless transmission media) such that the processor 308 can receive output. The processor 308 may be configured to perform a number of functions using the output. The wafer inspection tool can receive instructions or other information from the processor 308. The processor 308 and/or the electronic data storage unit 309 optionally may be in electronic communication with another wafer inspection tool, a wafer metrology tool, or a wafer review tool (not illustrated) to receive additional information or send instructions.

The computer subsystem 302, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high speed processing and software, either as a standalone or a networked tool.

The processor 308 and electronic data storage unit 309 may be disposed in or otherwise part of the system 300 or another device. In an example, the processor 308 and electronic data storage unit 309 may be part of a standalone control unit or in a centralized quality control unit. Multiple processors 308 or electronic data storage unit 309 may be used.

The processor 308 may be implemented in practice by any combination of hardware, software, and firmware. Also, its functions as described herein may be performed by one unit, or divided up among different components, each of which may be implemented in turn by any combination of hardware, software, and firmware. Program code or instructions for the processor 308 to implement various methods and functions may be stored in readable storage media, such as a memory in the electronic data storage unit 309 or other memory.

The system 300 of FIG. 6 is merely one example of a system that can use embodiments of the electron source 100 or embodiments of the method 250. Embodiments of the electron source 100 may be part of a defect review system, an inspection system, a metrology system, or some other type of system. Thus, the embodiments disclosed herein describe some configurations that can be tailored in a number of manners for systems having different capabilities that are more or less suitable for different applications.

Each of the steps of the method may be performed as described herein. The methods also may include any other step(s) that can be performed by the processor and/or computer subsystem(s) or system(s) described herein. The steps can be performed by one or more computer systems, which may be configured according to any of the embodiments described herein. In addition, the methods described above may be performed by any of the system embodiments described herein.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. An electron emitter comprising:
   a photocathode structure; and
   a protective film disposed on an exterior surface of the photocathode structure, wherein the protective film includes ruthenium, and wherein the protective film has a thickness from 1 nm to 20 nm.

2. The electron emitter of claim 1, wherein the photocathode structure includes an alkali halide.

3. The electron emitter of claim 2, wherein the alkali halide includes CsBr or CsI.

4. The electron emitter of claim 1, wherein the photocathode includes a ruthenium layer on a side of the photocathode structure opposite from the protective film.

5. The electron emitter of claim 1, wherein the photocathode includes a metal layer on a side of the photocathode structure opposite from the protective film.

6. The electron emitter of claim 1, wherein the protective film includes an alloy of ruthenium and platinum.

7. The electron emitter of claim 1, wherein the protective film is free of pinholes in at least an emitting area of the photocathode structure.

8. The electron emitter of claim 1, wherein the protective film is free of bubbles and inclusions in at least an emitting area of the photocathode structure.

9. The electron emitter of claim 1, wherein the protective film has imperfections only with a diameter or length dimension less than 1 nm.

10. The electron emitter of claim 1, wherein the protective film has fewer than $10^4$ impurities over an emitting area of the photocathode structure.

11. The electron emitter of claim 10, wherein the impurities include carbon, oxides, oxygen as a dissolved gas, sodium, or potassium.

12. The electron emitter of claim 1, wherein the protective film has a porosity less than or equal to 25%.

13. The electron emitter of claim 1, wherein the protective film has a packing density of greater than or equal to 0.92.

14. An electron beam tool including the electron emitter of claim 1, wherein the electron beam tool includes a detector that receives electrons generated by the electron emitter and reflected from a surface of a wafer.

15. A method comprising:
    providing a photocathode structure;
    depositing a protective film on an exterior surface of the photocathode structure, wherein the protective film includes ruthenium, and wherein the protective film has a thickness from 1 nm to 20 nm.

16. The method of claim 15, wherein the depositing includes ion sputtering, magnetron sputtering, or atomic layer deposition.

17. The method of claim 15, wherein the photocathode structure includes an alkali halide.

18. A method comprising:
    providing a photocathode structure, wherein the photocathode includes an alkali halide and a protective film disposed on an exterior surface of the photocathode structure, wherein the protective film includes ruthenium; and
    generating an electron beam from the photocathode structure when photons are directed at the photocathode structure.

19. The method of claim 18, further comprising performing a plasma clean of the photocathode structure.

20. The method of claim 18, wherein the protective film has a thickness from 1 nm to 20 nm.

* * * * *